US009825788B2

(12) United States Patent
Van De Beek et al.

(10) Patent No.: US 9,825,788 B2
(45) Date of Patent: Nov. 21, 2017

(54) ADAPTIVE BIAS TUNING

(71) Applicant: NXP B.V., Eindhoven (NL)

(72) Inventors: Remco Cornelis Herman Van De Beek, Eindhoven (NL); Liang Zhang, Singapore (SG); LiSong Feng, Singapore (SG); Juhui Li, Singapore (SG); Alan Chang, Singapore (SG)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 15/173,585

(22) Filed: Jun. 3, 2016

(65) Prior Publication Data

US 2016/0359648 A1    Dec. 8, 2016

(30) Foreign Application Priority Data

Jun. 3, 2015  (EP) .................................... 15170536

(51) Int. Cl.
*H03K 9/00*     (2006.01)
*H04L 27/06*    (2006.01)
(Continued)

(52) U.S. Cl.
CPC .......... *H04L 25/06* (2013.01); *G06K 19/0723* (2013.01); *H03D 1/18* (2013.01); *H04L 27/00* (2013.01); *H04L 27/06* (2013.01)

(58) Field of Classification Search
USPC ....... 375/216, 219, 217, 220, 221, 222, 240, 375/240.26, 240.27, 285, 284, 262, 295,
(Continued)

(56) References Cited

U.S. PATENT DOCUMENTS 3,727,135 A    4/1973   Holzer
5,940,447 A    8/1999   Connell et al.
(Continued)

FOREIGN PATENT DOCUMENTS

| CN | 104268490 A | 1/2015 |
|---|---|---|
| EP | 0 942 523 A1 | 9/1999 |
| WO | 2006008685 A1 | 1/2006 |

OTHER PUBLICATIONS

"ISO/IEC 14443-2:2001(E) Identification cards—Contactless integrated circuit(s) cards—Proximity cards—Part 2: Radio frequency power and signal interface", ISO/IEC, 17 pgs, (Jul. 1, 2001).
(Continued)

*Primary Examiner* — Linda Wong

(57) ABSTRACT

The present disclosure relates in general to devices, systems and methods for wireless communication, and in particular to communication using a proximity integrated circuit card (PICC). Example embodiments include a circuit (100) for a PICC, the circuit comprising an input stage (101), a decoding module (106) and a bias adjustment module (117), the bias adjustment module (117) configured to receive an output code from the decoding module and provide a bias adjustment signal to the input stage (101), the bias adjustment module (117) configured to iteratively tune the bias adjustment signal based on a measurement of the output code, with successive steps tuning the bias adjustment signal by a smaller amount until the output code is within a decoding range.

17 Claims, 5 Drawing Sheets

(51) Int. Cl.
*H04L 25/10* (2006.01)
*H04L 25/06* (2006.01)
*G06K 19/07* (2006.01)
*H04L 27/00* (2006.01)
*H03D 1/18* (2006.01)

(58) Field of Classification Search
USPC ....... 375/296, 316, 317, 319, 324, 340, 341, 375/346, 320
See application file for complete search history.

(56) References Cited

U.S. PATENT DOCUMENTS

| | | |
|---|---|---|
| 6,466,007 B1 | 10/2002 | Prazeres da Costa et al. |
| 6,680,985 B1 | 1/2004 | Strodtbeck et al. |
| 7,765,080 B2 | 7/2010 | Ludwig et al. |
| 7,944,279 B1 | 5/2011 | El Waffaoui |
| 2004/0135673 A1 | 7/2004 | Oberhuber et al. |
| 2004/0179510 A1 | 9/2004 | Kuffner et al. |
| 2006/0008685 A1 | 1/2006 | Mizude et al. |
| 2006/0154599 A1 | 7/2006 | Altaf et al. |
| 2007/0075143 A1 | 4/2007 | Higashi |
| 2009/0032935 A1 | 2/2009 | Bhowmik et al. |
| 2009/0033462 A1 | 2/2009 | Kitayoshi et al. |
| 2009/0046809 A1 | 2/2009 | Meltzer |
| 2009/0154599 A1 | 6/2009 | Siti et al. |
| 2009/0189688 A1 | 7/2009 | Nehrig et al. |
| 2009/0205436 A1* | 8/2009 | Garverick ............. G01L 1/2256 73/777 |
| 2009/0302935 A1 | 12/2009 | Iwata et al. |
| 2010/0158157 A1 | 6/2010 | Iwata et al. |
| 2011/0121880 A1 | 5/2011 | Lee et al. |
| 2012/0057656 A1 | 3/2012 | Bae et al. |
| 2012/0083205 A1 | 4/2012 | Marcu et al. |
| 2012/0134444 A1 | 5/2012 | Tsukamoto |
| 2012/0183100 A1 | 7/2012 | Luzzi et al. |
| 2013/0127546 A1* | 5/2013 | Marra ...................... H03F 1/30 330/296 |
| 2014/0086347 A1 | 3/2014 | Kang |
| 2014/0192931 A1 | 7/2014 | VandeBeek et al. |
| 2014/0323043 A1 | 10/2014 | Shana'a et al. |
| 2015/0065043 A1 | 3/2015 | Heng et al. |
| 2015/0172080 A1 | 6/2015 | Van de Beek et al. |

OTHER PUBLICATIONS

"RFID Handbook: Fundamentals and Applications in Contactless Smart Cards, Radio Frequency Identification and Near-Field Communication—2nd Ed."; Klaus Finkenzeller, ISBN: 0-470-84402-7, p. 278, 2003.

M. van Elzakker et al.; "A 1.9uW 4.4fJ/Conversion-step 10b 1MS/s Charge-Redistribution ADC"; In ISSCC Dig. Tech Papers, Feb. 2008.

European Search Report , 13199914.6, dated May 21, 2014.
European Search Report , 14192871.3, dated Apr. 8, 2015.

\* cited by examiner

ADAPTIVE BIAS TUNING

CROSS-REFERENCE TO RELATED APPLICATIONS

This application claims the priority under 35 U.S.C. §119 of European patent application no. 15170536.5, filed on Jun. 3, 2015, the contents of which are incorporated by reference herein.

FIELD

The present disclosure relates in general to devices, systems and methods for wireless communication, and in particular to communication using a proximity integrated circuit card (PICC).

BACKGROUND

PICCs are widely used for applications where a wireless connection is required between a contactless smart card and a reader. Some uses of such cards include electronic ticketing for public transport, contactless payment for credit and debit cards, and digital identification cards.

ISO/IEC 14443 is an international standard that defines proximity cards used for identification, together with the associated transmission protocols, and defines such cards in general as proximity integrated circuit cards.

SUMMARY

According to a first aspect of the present disclosure there is provided a circuit for a proximity integrated circuit card, the circuit comprising:

an input stage having a first input for connection to a radio antenna to receive an input signal, a second input for adjustment of a bias of the input stage and an output for providing a bias adjusted input signal;

a decoding module connected to the input stage and configured to provide an output code from the bias adjusted input signal; and a bias adjustment module connected to receive the output code from the decoding module and configured to provide a bias adjustment signal to the second input of the input stage, wherein the bias adjustment module is configured to iteratively tune the bias adjustment signal based on a measurement of the output code, with successive steps tuning the bias adjustment signal by a smaller amount until the output code is within a decoding range.

The decoding module may have an output resolution of N bits, and the decoding range may include an output of $2^{N-1}$. The decoding range may be a single value, for example $2^{N-1}$, or may be a range of values within a predetermined number of the single value. The predetermined number may for example be one or two.

With the bias adjustment module having a resolution of M bits, the bias adjustment module may be configured to initially set the bias adjustment signal at a value corresponding to $2^{M-1}$. This corresponds to a bias voltage provided to the input stage in the middle of an available tuning range.

The bias adjustment module may be configured to increase or decrease the bias adjustment signal by a value corresponding to $2^{m-2}$ after initially setting m to be equal to M and to reduce the value of m after each iteration step. The bias adjustment module may, for example, be configured to adjust the bias adjustment signal in a first direction (i.e. to increase or decrease) if the output code is above the decoding range and to adjust the bias adjustment signal in a second opposing direction (i.e. to decrease or increase) if the output code is below the decoding range.

The bias adjustment module may be configured to stop tuning the bias adjustment signal when the output code reaches or is within the decoding range or when the value of m reaches zero.

The decoding module may comprise a successive approximation register analog to digital converter.

The decoding module may be configured to decode an amplitude shift keyed input signal, for example an ASK type B signal.

According to a second aspect of the present disclosure there is provided a proximity integrated circuit card comprising the circuit according to the first aspect; and an antenna connected to the input stage of the circuit.

There may be provided a computer program, which when run on a computer, causes the computer to configure the bias adjustment module disclosed herein to perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software implementation may be an assembly program.

The computer program may be provided on a computer readable medium, which may be a physical computer readable medium, such as a disc or a memory device, or may be embodied as a transient signal. Such a transient signal may be a network download, including an internet download.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
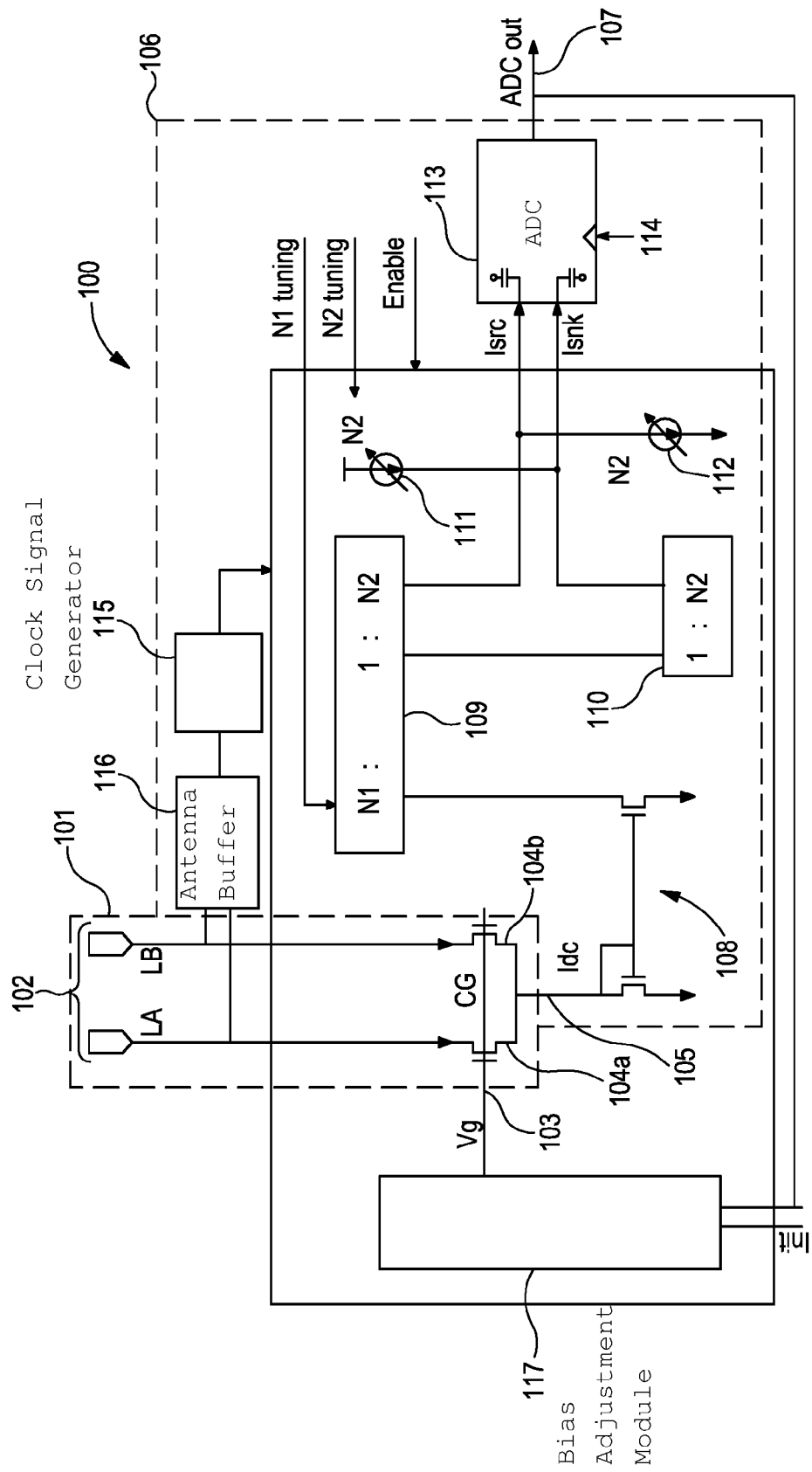
FIG. 1 is a schematic diagram of an exemplary implementation of an ASK type B demodulator and ADC.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

The ISO/IEC 14443 standard defines that a receiver unit in a PICC should be able to handle an incoming amplitude shift keyed (ASK) type B signal (i.e. with a modulation ratio of <100%) having different data rates, modulation index and field strength while having an ultra-low power consumption and generating a digital output signal for subsequent signal processing. Traditional coherent receiver architectures, such as superheterodyne, direct conversion and low IF architectures, are able to receive and process such signals, but with high power consumption and circuit complexity, neither of which is desirable in a PICC. If a non-coherent receiver is used, this reduces circuit complexity since a carrier recovery circuit is not required. One example of such a receiver is disclosed in EP2752792, in which a PLL/DLL free high bandwidth receiver for a type B ISO/IEC 14443 compatible contactless smart card is proposed. This uses an integrate-and-dump filter clocked by a static frequency divider that can be controlled directly by the antenna.

A particular problem with PICC implementations is how to handle incoming signals, for example ASK type B signals, having different data rates, which may range from 106 kbps to 6.78 Mbps (over 1 Mbps being generally considered a very high bit rate), a varying modulation index (ranging between 6 and 40% in practical cases, with a typical value around 20%) and over a range of field strengths (typically from 1 Nm to 8 Nm) while maintaining an ultra-low power consumption and small circuit size and maximising the signal dynamic range.

FIG. 1 illustrates an exemplary implementation of a circuit 100 for receiving and decoding an input signal, as part of a proximity integrated circuit card. The circuit 100 comprises an input stage 101, a decoding module 106 and a bias adjustment module 117, the bias adjustment module 117 configured to receive an output code from the decoding module 106 and provide a bias adjustment signal to the input stage 101, the bias adjustment module 117 configured to iteratively tune the bias adjustment signal based on a measurement of the output code, with successive steps tuning the bias adjustment signal by a smaller amount until the output code is within a decoding range.

The input stage 101 has a first input 102 comprising differential connections LA, LB for connection to a radio antenna for receiving a radio signal. A second input 103 is provided for providing a bias voltage Vg to a pair of transistors 104a, 104b. In the illustrated example, the transistors are p-type MOSFETs arranged as a differential common gate pair, with the bias voltage input 103 connected to the gate of each transistor and the transistor sources connected to the differential antenna inputs LA, LB of the first input 102. The drains of the transistors 104a, 104b are connected together and provide an output 105 for providing a bias adjusted input signal $I_{dc}$.

The common gate input stage 101 acts as a full wave rectifier for the signal provided at the first input 102, and provides the bias adjusted input signal at the output 105 in the form of a current signal $I_{dc}$. In alternative example embodiments the input stage may comprise a single transistor configured to provide half wave rectification.

The output signal of the input stage 101 is provided to the decoding module 106, which is configured to provide an output code ADCout at an output 107 of the circuit 100 from the bias adjusted input signal $I_{dc}$. In the example embodiment in FIG. 1, the decoding module 106 comprises current mirrors 108, 109, 110 and variable current sources 111, 112, which are together arranged to transform the bias adjustment signal $I_{dc}$ at the input stage output 105 to a differential signal pair $I_{src}$, $I_{snk}$, which is provided to an analog to digital converter (ADC) 113. A differential signal at the input 102 is thereby converted to a single-ended current $I_{dc}$ by the PMOS differential common gate pair 104a, 104b, and then scaled by current mirrors 108, 109, 110, converting the signal back to differential mode and removing any DC component. Removing the DC component from the signal relaxes the ADC input current dynamic range requirement. The ADC then converts the signal into the digital domain. The ADC in the example embodiment is a successive approximation register (SAR) ADC, an example of which is described in EP2752792.

The first current mirror 108 provides a mirror of the output signal $I_{dc}$ to a second current mirror 109. The second current mirror 109 provides two outputs: a first output being a mirror signal provided to a third current mirror 110 and a second output $I_{src}$ being a scaled version of the current signal according to a ratio N1:N2. The values of N1 and N2 may be chosen to determine the degree of scaling and thereby to handle different data rates. A higher ratio of N2:N1 (i.e. larger N2 and/or smaller N1) is more applicable for higher data rates. The value of N2 may also be adjusted to provide an automatic gain control (AGC) function for controlling the output signal swing of the ADC 113. The third current mirror 110 also scales the current according to the ratio N1:N2, and provides a negative version $I_{snk}$ of the output of the second current mirror 109.

The SAR ADC 113 samples the differential input signal provided, and outputs the output code $ADC_{out}$ at the circuit output 107, the output code being in the form of a series of N-bit words, where N is the resolution of the ADC 113. A clock signal is provided to the ADC 113 at a clock input 114, the clock signal being provided by an integrate-and-dump type clock signal generator 115. The clock signal generator 115 is connected to the input 102 via an antenna buffer 116, and derives the clock signal from the input signal. An example of an integrate-and-dump type clock signal generator is described further in EP2752792.

The bias adjustment module 117 is connected to receive the output code $ADC_{out}$ from the ADC 113 and is configured to provide the bias adjustment signal $V_g$ to the second input 103 of the input stage 101. The bias adjustment module 117, the operation of which is described below in more detail, is configured to iteratively tune the bias adjustment signal $V_g$ based on a measurement of the output code $ADC_{out}$, in which successive steps involve tuning the bias adjustment signal by a smaller amount until the output code $ADC_{out}$ is within a decoding range. In a typical example, the decoding range is in the mid-range of the ADC output, for example if the ADC output ranges from 0 to 255 (i.e. where N=8), the decoding range would include the value 128, which is in the middle of the output range. In other words, if the resolution of the ADC output is N bits, the decoding range may include an output having a value of $2^{N-1}$. The decoding range may, for example have a range of values either side of a preferred mid-range value or alternatively may be a specific single value.

Upon initialization of the circuit 100, the bias adjustment module 117 may in some example embodiments be configured to initially set the bias adjustment signal $V_g$ at a value corresponding to a mid-range value of the module's output range. For example, if the bias adjustment module 117 is configured to output a signal with a resolution of M bits, the module 117 may be configured to initially set the bias adjustment signal at a value corresponding to $2^{M-1}$.

In the example embodiment of FIG. 1, the ADC 113 provides an unsigned output at the circuit output 107 based on a differential input. Other arrangements may be possible, for example a signed output and/or a single ended input.

Figure 2:
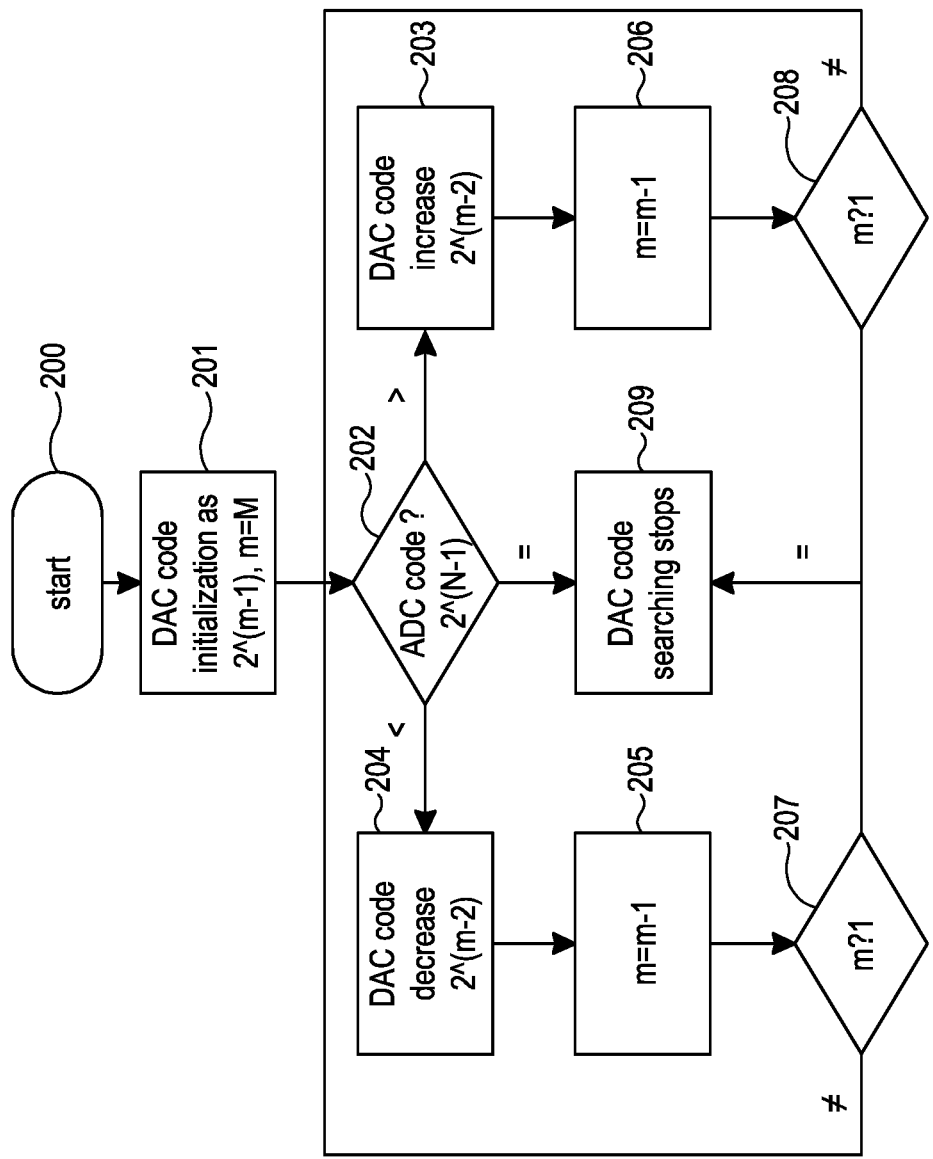
FIG. 2 is a flow diagram illustrating an exemplary method of bias tuning for the input stage of FIG. 1.

The bias adjustment module 117 may carry out an iterative tuning procedure as outlined in the example flowchart of FIG. 2. Upon initialization (step 200), which may be done for example by providing a trigger signal to the bias adjustment module 117, the output code of the module 117 is initialized as $2^{M-1}$, and a starting value of a variable m is set equal to M (step 201). The module 117 then checks the ADC output code and compares this to the value of $2^{N-1}$ (step 202), which defines the required decoding range mid-way between 0 and $2^N$ for an unsigned output. If the ADC output code is greater than $2^{N-1}$, the output code of the module 117 is increased by $2^{m-2}$ (step 203). If, alternatively, the ADC output code is less than $2^{N-1}$, the output code of the module 117 is decreased by $2^{m-2}$ (step 204). Depending on the sign of the gain from bias voltage $V_g$ to the ADC output code, step 203 may alternatively implement a decrease and step 204 may implement an increase of the output code of module 117. After either step 203, 204, the value of m is then decremented by 1 (steps 205, 206), followed by a check to see whether m is equal to one (steps 207, 208). If m=1, the searching process terminates (step 209). If m is not equal to one, the step of checking the ADC output code repeats (step 202). An additional option of proceeding straight to the termination step 209 may be provided to account for the case where the ADC code is equal to $2^{N-1}$. The same effect may, however, be achieved by making one of the branches joining steps 202 and steps 203 and 204 account for the cases where the output code is either greater or equal to, or is less than or equal to, $2^{N-1}$.

The above described bias voltage adaptive tuning method can be used to find the correct biasing voltage $v_g$ that results in the maximum ADC output signal range regardless of the field strength of the input signal, which may typically vary from 1 Nm to 8 Nm.

The field strength may change depending on whether the PICC is moving in relation to the reader, which can result in the field strength changing over the process of initialization. To compensate for this possibility, a DC tracking control may be provided to control the ADC output DC level, for example by gradually updating a previously established code of module 117 such that the updated value of $V_g$ then brings the ADC output code closer to the desired DC level, so that the output is prevented from clipping. An example DC tracking control algorithm and circuit is described in co-pending European application 14192871.3. Under normal circumstances, however, the variation of field strength during initialization will be sufficiently small for such compensation to be unnecessary.

Figure 3:
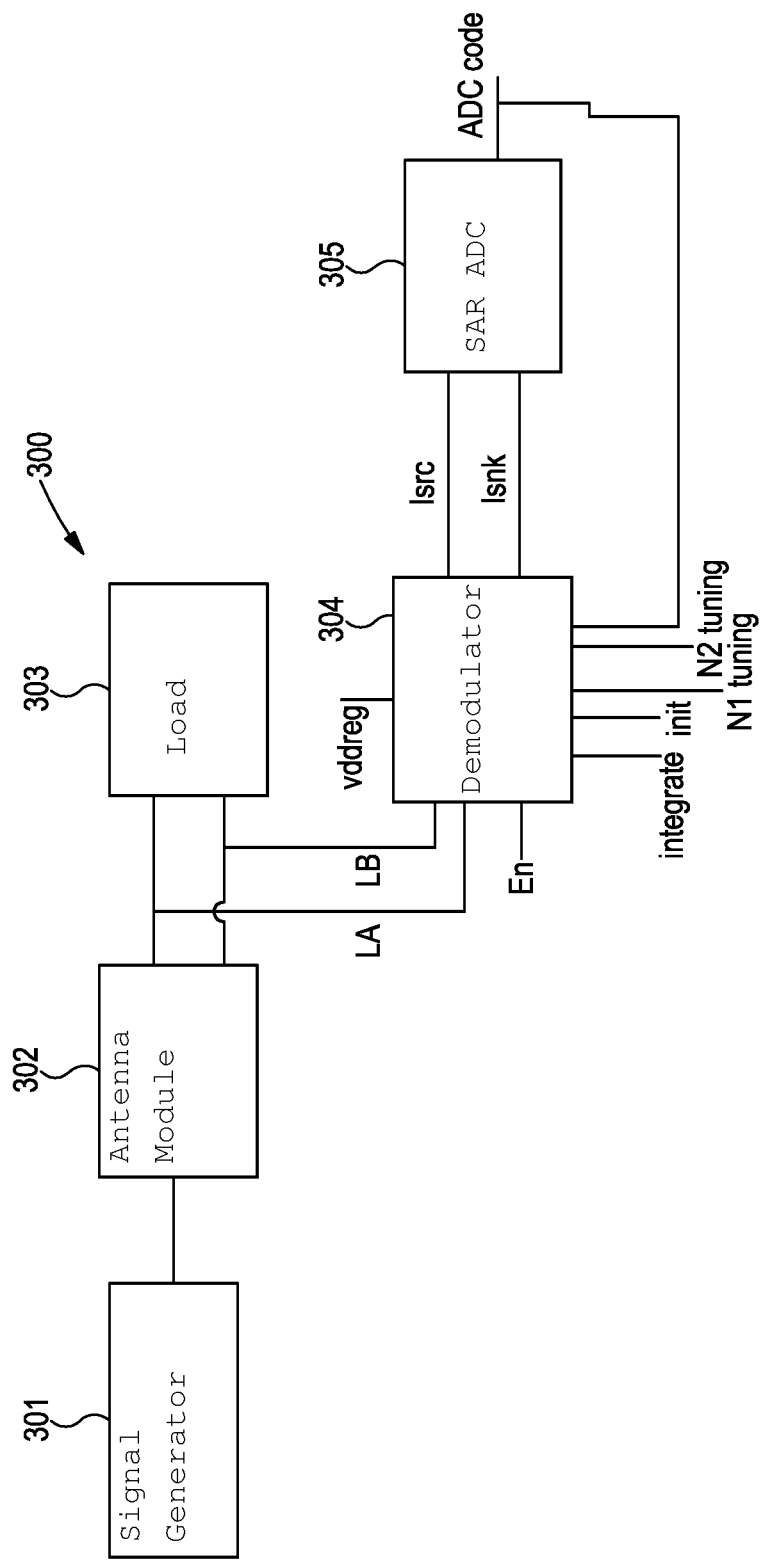
FIG. 3 is a schematic diagram of the demodulator and ADC of FIG. 1 as part of an ASK type B signal path.

FIG. 3 illustrates an example embodiment of an ASK type B signal path 300 in which a circuit of the type described herein is incorporated. An ASK modulation signal generator 301 generates a modulated signal, which is received by an antenna model 302, connected to a representative load 303. A differential signal LA, LB is provided to an ASK type B demodulator 304, which provides a differential output signal $I_{src}$, $I_{snk}$ to an integrate-and-dump type SAR ADC 305. The demodulator is provided with a regulated voltage supply (vddreg), with an enable signal (En), a clock signal (integrate), an initialization signal (init) and with tuning signals N1, N2, and monitors the output ADC code provided by the ADC 305.

Figure 4:
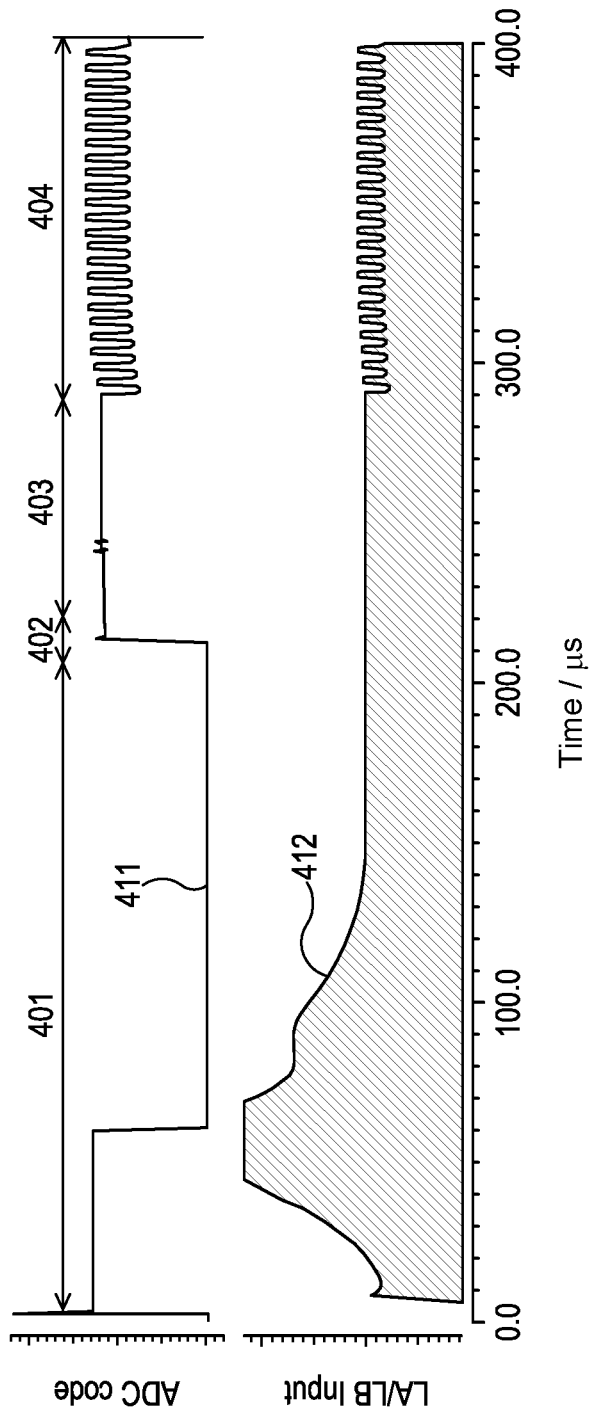
FIG. 4 is a plot of exemplary ADC output codes and input signal as a function of time.

FIG. 4 is a plot of a typical ADC output code 411 and LA/LB input 412 as a function of time before, during and after initialization of a circuit according to an example embodiment. During a first time period 401, the system is being set up while the signal and supply becomes stable. At the end of period 401, the ADC code is clipping at the lower end of its range, making signal reception impossible. After about 200 μs, the bias adjustment module 117 (FIG. 1) is initialized and the adaptive bias tuning procedure (FIG. 2) begins, in a second time period 402. This procedure may last only a few microseconds before the tuning procedure is complete, and is followed by a third time period 403 of silence before a data signal is transmitted in a fourth time period 404.

Figure 5:
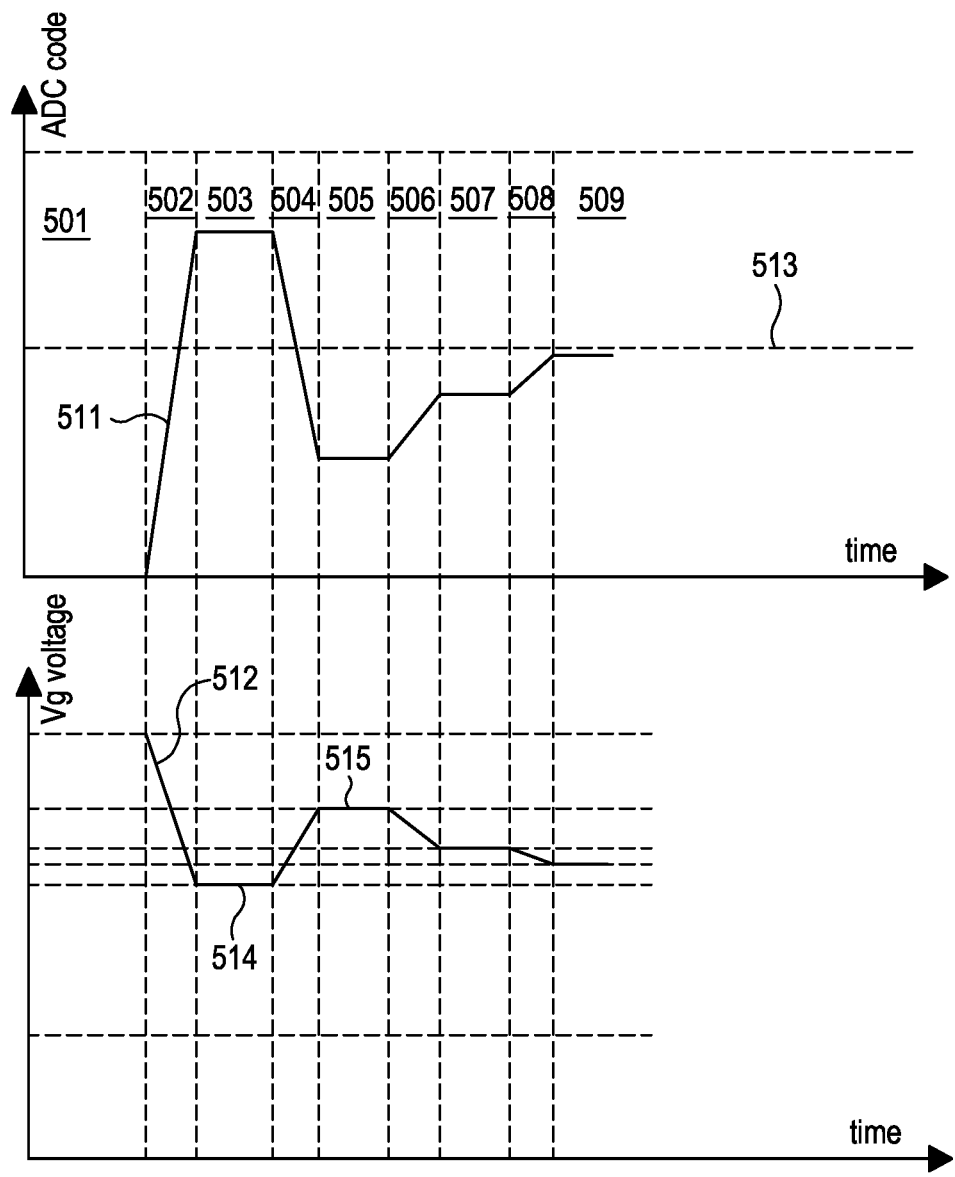
FIG. 5 is a plot of ADC output codes and bias voltage as a function of time over an exemplary tuning routine.

An expanded view of a typical sequence of ADC codes 511 and bias voltage signals 512 is illustrated in FIG. 5, representing the tuning process corresponding to the second time period 402 in FIG. 4, which encompasses a series of successive ADC output code comparison and bias signal tuning steps. In a first period 501, the bias adjustment module 117 is disabled. An initialization signal is provided at the start of a second period 502, causing the module 117 to initialize by setting its output to an initial value, which in the embodiments described above corresponds to a mid-range of the available tuning range. This causes the bias voltage to transition to a first value 514 over the second period 502. In a third period 503, a comparison is made of the ADC output code, resulting in the output code being found to be greater than the mid-range 513 (corresponding to $2^{N-1}$ for an N bit resolution output). The bias voltage is then adjusted to a second value 515 over a fourth period 504. This results in the ADC output code falling below the mid-range value 513 and, following a further comparison step in a fifth period 505, the bias voltage is adjusted again (by a smaller amount) in a sixth period 506, resulting in the ADC code rising and getting closer to the mid-range value 513. After a further tuning cycle in periods 507 and 508, the tuning process terminates with the ADC output code being close to the mid-range value 513.

From reading the present disclosure, other variations and modifications will be apparent to the skilled person. Such variations and modifications may involve equivalent and other features which are already known in the art of wireless communication, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and any reference signs in the claims shall not be construed as limiting the scope of the claims.

The invention claimed is:

1. A circuit for a proximity integrated circuit card, the circuit comprising:

an input stage having a first input for connection to a radio antenna to receive an input signal, a second input for adjustment of a bias of the input stage and an output for providing a bias adjusted input signal;

a decoding module connected to the input stage and configured to provide an output code from the bias adjusted input signal; and a bias adjustment module connected to receive the output code from the decoding module and configured to provide a bias adjustment signal to the second input of the input stage, the bias adjustment module having a resolution of M bits, where M is an integer, and the bias adjustment module is configured to initially set the bias adjustment signal at a value corresponding to $2^{M-1}$, wherein the bias adjustment module is configured to iteratively tune the bias adjustment signal based on a measurement of the output code, with successive steps tuning the bias adjustment signal by a smaller amount until the output code is within a decoding range.

2. The circuit of claim 1 wherein, with the decoding module having an output resolution of N bits, where N is an integer, the decoding range includes an output of $2^{N-1}$.

3. The circuit of claim 1 wherein the bias adjustment module is configured to increase or decrease the bias adjustment signal by a value corresponding to $2^{m-2}$ after initially setting m to be equal to M and to reduce the value of m after each iteration step.

4. The circuit of claim 3 wherein the bias adjustment module is configured to adjust the bias adjustment signal in a first direction when the output code is above the decoding range and to adjust the bias adjustment signal in a second opposing direction when the output code is below the decoding range.

5. The circuit of claim 3, wherein the bias adjustment module is configured to stop tuning the bias adjustment signal when the output code is within the decoding range or when the value of m reaches one.

6. The circuit of claim 1, wherein the decoding module comprises a successive approximation register analog to digital converter.

7. The circuit of claim 1, wherein the decoding module is configured to decode an amplitude shift keyed input signal.

8. A proximity integrated circuit card comprising:
the circuit according to claim 1; and
an antenna connected to the input stage of the circuit.

9. A circuit for a proximity integrated circuit card, the circuit comprising:
an input stage having a first input for connection to a radio antenna to receive an input signal, wherein the first input signal is a differential signal, a second input for adjustment of a bias of the input stage and an output for providing a bias adjusted input signal, the bias adjusted input signal being a single-ended signal;

a decoding module connected to the input stage and configured to provide an output code from the bias adjusted input signal, wherein the decoding module includes current mirrors and an analog to digital converter, and wherein the decoding module is configured to convert the bias adjusted input signal to a differential signal and to provide the differential signal to the analog to digital converter; and a bias adjustment module connected to receive the output code from the decoding module and configured to provide a bias adjustment signal to the second input of the input stage, wherein the bias adjustment module is configured to iteratively tune the bias adjustment signal based on a measurement of the output code, with successive steps tuning the bias adjustment signal by a smaller amount until the output code is within a decoding range.

10. The circuit of claim 9 wherein, with the decoding module having an output resolution of N bits, where N is an integer, the decoding range includes an output of $2^{N-1}$.

11. The circuit of claim 9 wherein, with the bias adjustment module having a resolution of M bits, where M is an integer, the bias adjustment module is configured to initially set the bias adjustment signal at a value corresponding to $2^{M-1}$.

12. The circuit of claim 11 wherein the bias adjustment module is configured to increase or decrease the bias adjustment signal by a value corresponding to $2^{m-2}$ after initially setting m to be equal to M and to reduce the value of m after each iteration step.

13. The circuit of claim 12 wherein the bias adjustment module is configured to adjust the bias adjustment signal in a first direction when the output code is above the decoding range and to adjust the bias adjustment signal in a second opposing direction when the output code is below the decoding range.

14. The circuit of claim 12, wherein the bias adjustment module is configured to stop tuning the bias adjustment signal when the output code is within the decoding range or when the value of m reaches one.

15. The circuit of claim 9, wherein the decoding module comprises a successive approximation register analog to digital converter.

16. The circuit of claim 9, wherein the decoding module is configured to decode an amplitude shift keyed input signal.

17. A proximity integrated circuit card comprising:
the circuit according to claim 9; and
an antenna connected to the input stage of the circuit.

* * * * *